US009026979B2

(12) United States Patent
Sato et al.

(10) Patent No.: US 9,026,979 B2
(45) Date of Patent: May 5, 2015

(54) ANALYSIS SUPPORT APPARATUS, ANALYSIS SUPPORT METHOD, AND COMPUTER PRODUCT

(71) Applicant: Fujitsu Limited, Kawasaki-shi, Kanagawa (JP)

(72) Inventors: Hiroyuki Sato, Kawasaki (JP); Satoshi Matsubara, Machida (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/177,540

(22) Filed: Feb. 11, 2014

(65) Prior Publication Data

US 2014/0298121 A1    Oct. 2, 2014

(30) Foreign Application Priority Data

Mar. 29, 2013  (JP) ................................ 2013-075084

(51) Int. Cl.
*G06F 11/22* (2006.01)
*G06F 17/50* (2006.01)
*G11C 29/02* (2006.01)

(52) U.S. Cl.
CPC ................................. *G11C 29/022* (2013.01)

(58) Field of Classification Search
CPC  G06F 17/505; G06F 17/5022; G06F 17/5036
USPC .................. 716/104, 106, 107, 108, 109, 136
See application file for complete search history.

(56) References Cited

U.S. PATENT DOCUMENTS 5,617,326 A * 4/1997 Yamamoto ...................... 703/14
2009/0051396 A1 * 2/2009 Shimamoto ................... 327/153

FOREIGN PATENT DOCUMENTS

| JP | 05-342294 | 12/1993 |
| JP | 06-110959 | 4/1994 |
| JP | 07-121578 | 5/1995 |
| JP | 09-179895 | 7/1997 |

* cited by examiner

*Primary Examiner* — Brian Ngo
(74) *Attorney, Agent, or Firm* — Fujitsu Patent Center

(57) ABSTRACT

An analysis support apparatus includes a processor that is configured to acquire circuit data that indicates plural elements within a circuit and a node to which at least two elements are connected among the elements, and determine, based on the acquired circuit data and by referring to a memory unit that correlates and stores for each of the elements, the type of the element and information that indicates whether the phase of a signal is reversed when the signal passes through the element, whether the phase of the signal is reversed when the signal that passed through a given node among a plurality of nodes within the circuit returns to the given node; and an output unit that outputs information that indicates the given node when the processor determines that the phase of the signal is not reversed.

6 Claims, 15 Drawing Sheets

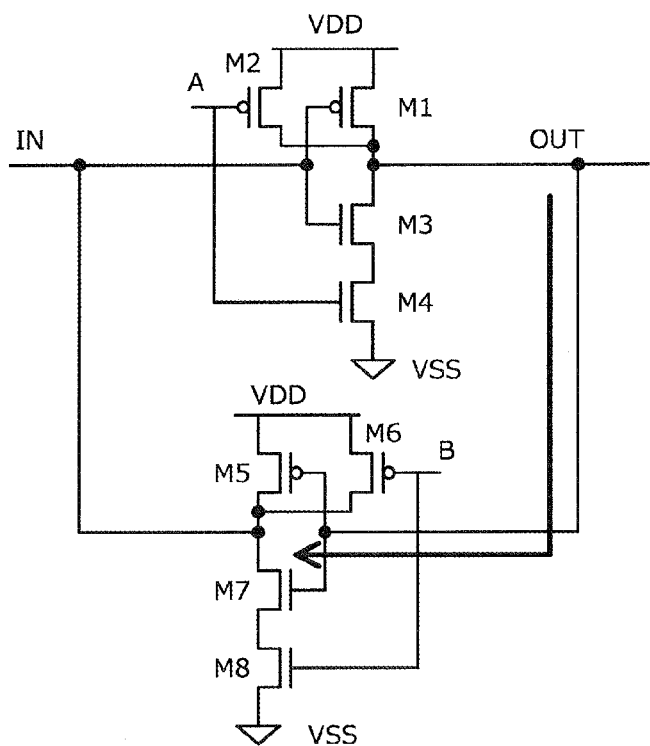
FIG.10
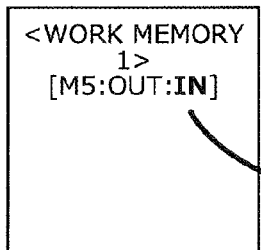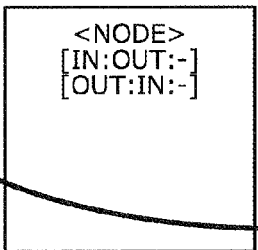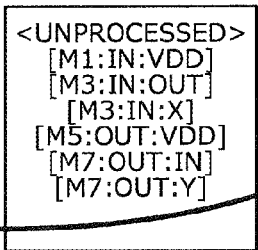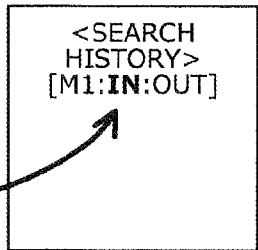

FIG.11
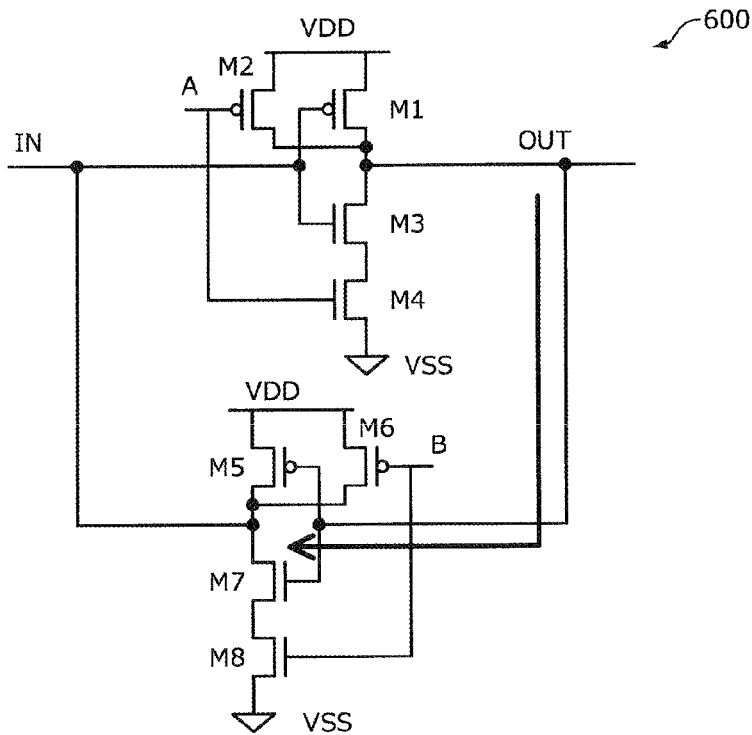
1101
<WORK MEMORY 2>
Ans = [M5:OUT:IN][M1:IN:OUT] = = -1 * -1 = 1(SAME PHASE)
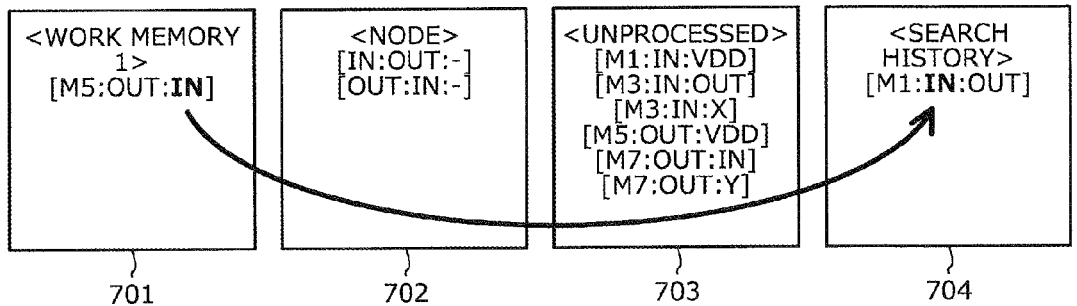
| <WORK MEMORY 1> [M5:OUT:IN] | <NODE> [IN:OUT:-] [OUT:IN:-] | <UNPROCESSED> [M1:IN:VDD] [M3:IN:OUT] [M3:IN:X] [M5:OUT:VDD] [M7:OUT:IN] [M7:OUT:Y] | <SEARCH HISTORY> [M1:IN:OUT] |
|---|---|---|---|
| 701 | 702 | 703 | 704 |

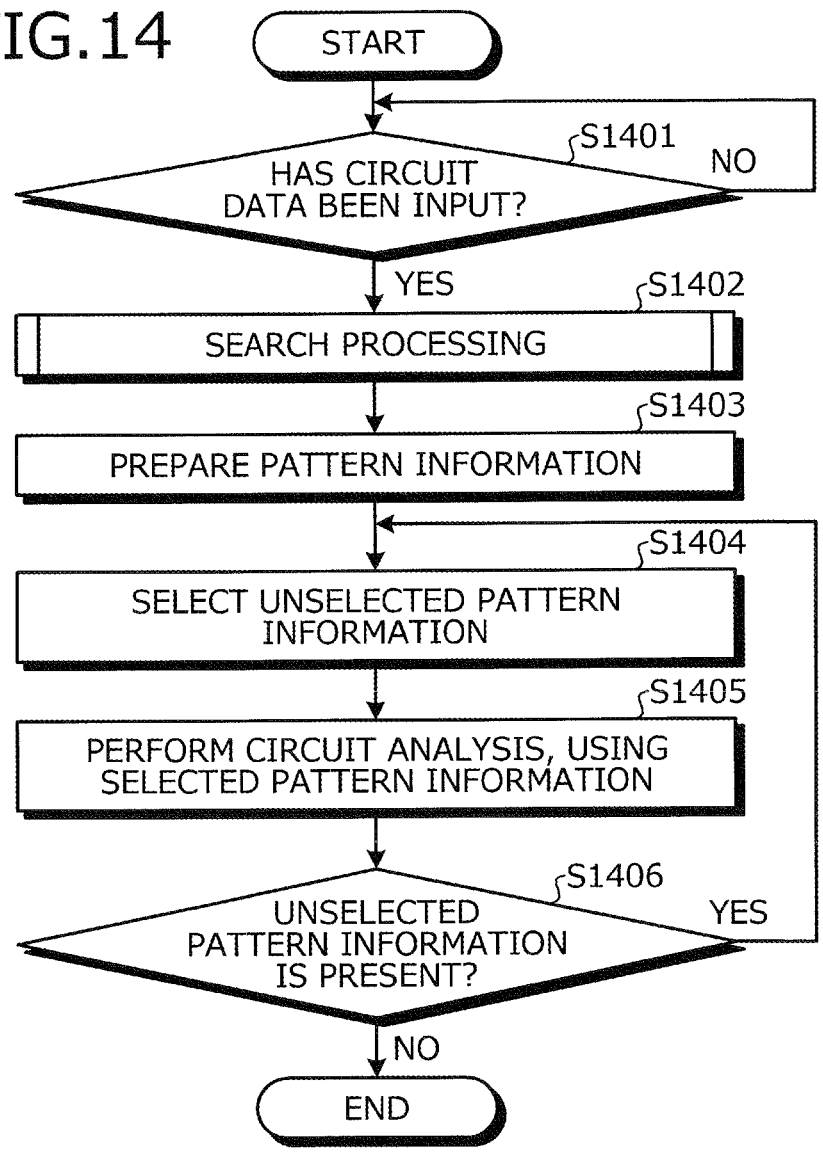

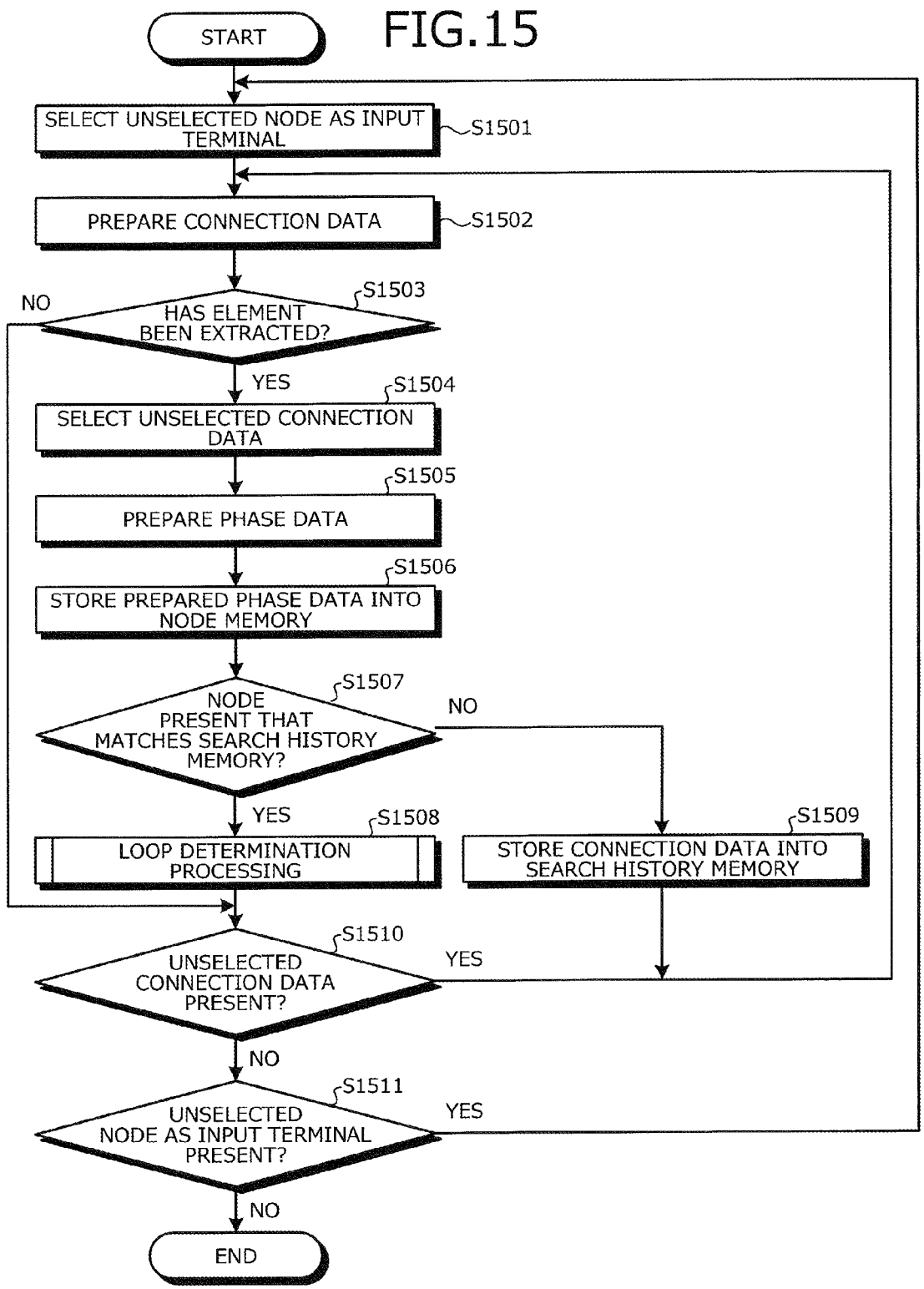

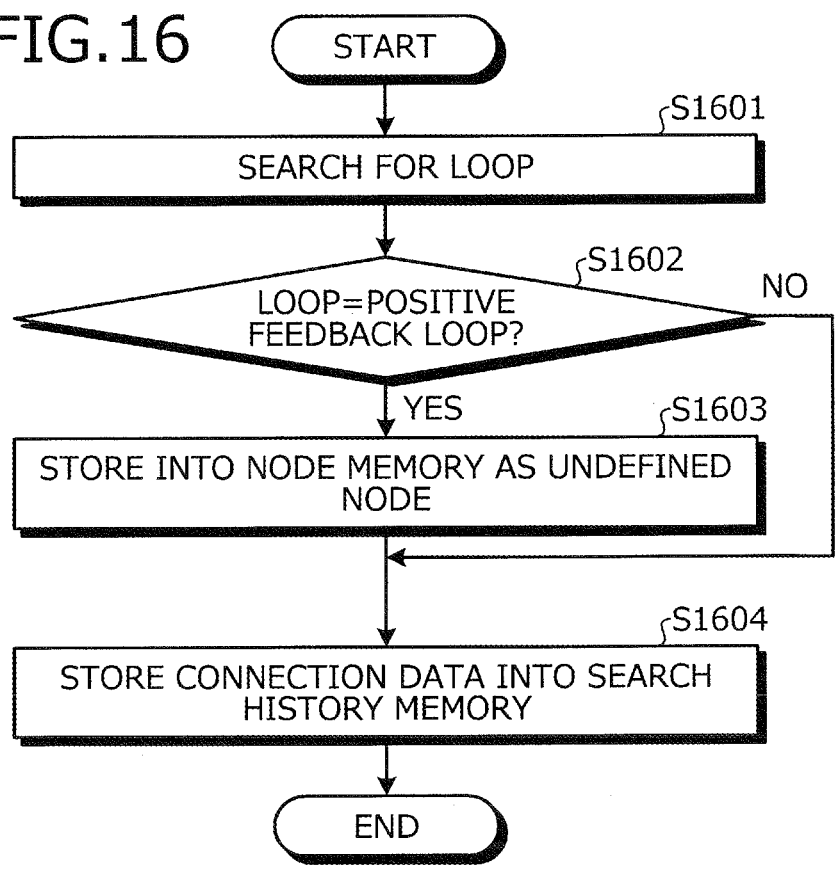

ANALYSIS SUPPORT APPARATUS, ANALYSIS SUPPORT METHOD, AND COMPUTER PRODUCT

CROSS REFERENCE TO RELATED APPLICATIONS

This application is based upon and claims the benefit of priority of the prior Japanese Patent Application No. 2013-075084, filed on Mar. 29, 2013, the entire contents of which are incorporated herein by reference.

FIELD

The embodiments discussed herein are related to an analysis support apparatus, an analysis support method, and a computer product.

BACKGROUND

Conventionally, circuit analyzing software executes a direct current analysis of a circuit-under-analysis to calculate voltage values of nodes within the circuit and executes an alternating current analysis or transient analysis, using the calculated voltage values as initial voltage values.

In the direct current analysis, to analyze the operation of the circuit, the circuit analyzing software performs analysis by setting the voltage value of a node within the circuit to a given voltage value and calculates the voltage value of the node, which represents one operational state of the circuit, corresponding to a case where the voltage value of the node within the circuit is set at the specified voltage.

As for related technologies, for example, there is a technology of executing circuit analysis to detect a non-convergent node at which the voltage value does not converge on a solution. For example, there is a technology of setting the average value of the voltage values that have converged on the solution at other nodes as the initial value and re-executing the circuit analysis, when the circuit analysis has been executed and a non-convergent node is detected. For example, there is a technology of executing the circuit analysis and performing the convergence determination by the last voltage value and the second to last voltage value with respect to the node. For example, there is a technology of seeking the solution of the voltage value by activating plural solvers of the Newton's method, the Damped-Newton's method, etc., in a given order until a given convergence condition is satisfied. For examples of such technologies, refer to Japanese Laid-Open Patent Publication Nos. H7-121578, H5-342294, H6-110959, and H9-179895.

In the above conventional technologies, however, since the voltage values of the nodes that represent each state of plural operational states of the circuit are calculated, it is difficult determine in the circuit, the node for which the voltage value should be set at a voltage value that differs from the given voltage value in the direct current analysis.

SUMMARY

According to an aspect of an embodiment, an analysis support apparatus includes a processor that is configured to acquire circuit data that indicates plural elements within a circuit and a node to which at least two elements are connected among the elements, and determine, based on the acquired circuit data and by referring to a memory unit that correlates and stores for each of the elements, the type of the element and information that indicates whether the phase of a signal is reversed when the signal passes through the element, whether the phase of the signal is reversed when the signal that passed through a given node among a plurality of nodes within the circuit returns to the given node; and an output unit that outputs information that indicates the given node when the processor determines that the phase of the signal is not reversed.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 7, 8, 9, 10, 11, 12, and 13 are explanatory diagrams of one example of operation of the analysis support apparatus 100;

FIG. 14 is a flowchart of one example of analysis support processing of the analysis support apparatus 100;

FIG. 15 is a flowchart of one example of search processing at step S1402; and

FIG. 16 is a flowchart of loop determination processing at step S1508.

DESCRIPTION OF EMBODIMENTS

Embodiments of an analysis support apparatus, analysis support method, and a computer product will be described in detail with reference to the accompanying drawings.

Figure 1:
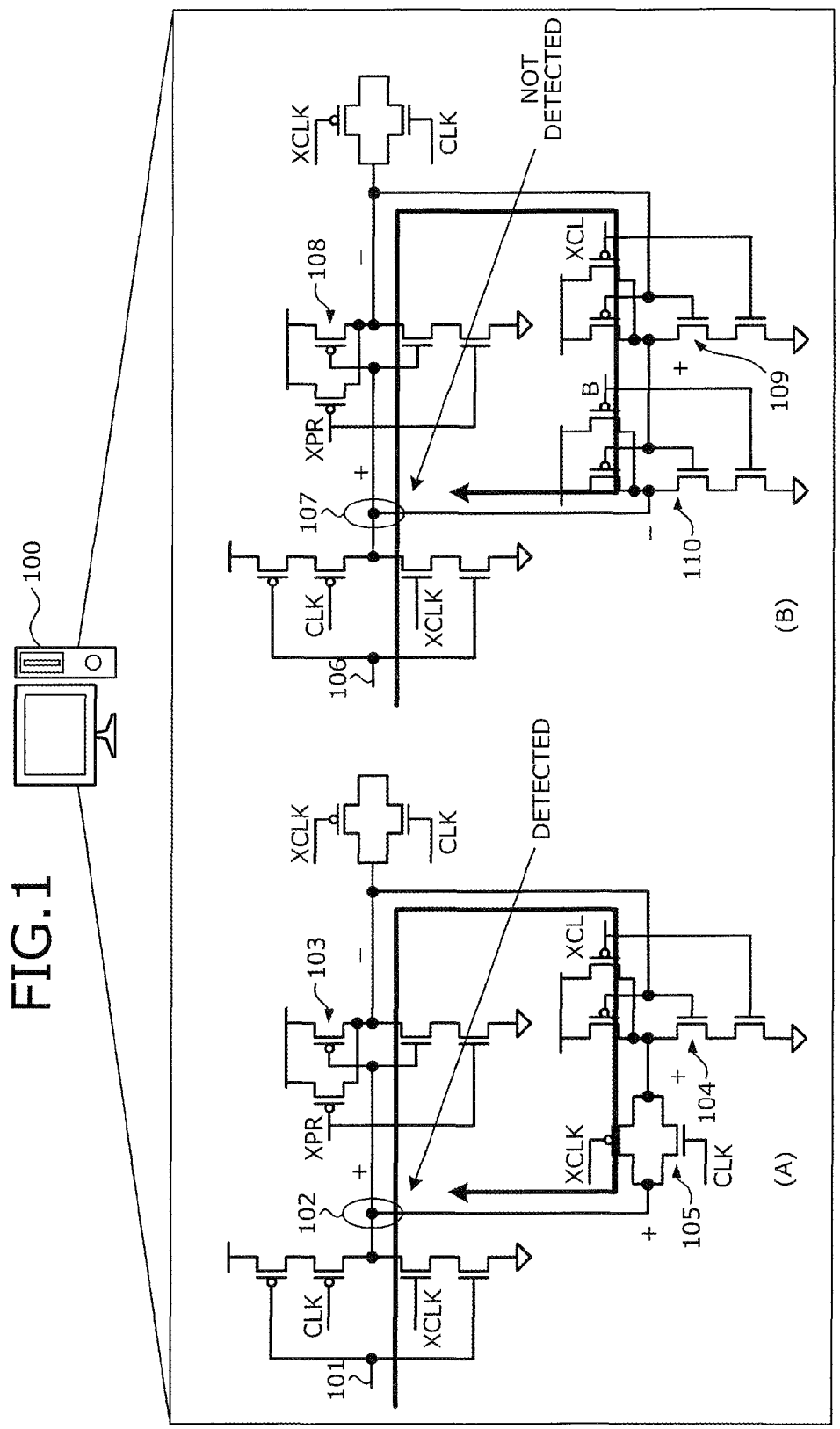
FIG. 1 is an explanatory diagram of one example of analysis support processing by an analysis support apparatus 100 according to an embodiment.

FIG. 1 is an explanatory diagram of one example of analysis support processing by an analysis support apparatus 100 according to an embodiment. In FIG. 1, the analysis support apparatus 100 is a computer that detects a positive feedback loop out of a circuit-under-analysis and outputs information that indicates nodes included in the positive feedback loop.

The positive feedback loop is a loop in which a signal returns that is of the same phase as a signal that has already passed. Consequently, it is possible that the voltage value of the node within the loop will not converge on a solution. In the following description, the phase of the signal input from an input terminal within the circuit will occasionally be described as "positive phase". On the other hand, the phase of the signal formed by reversing the phase of a signal of the positive phase will occasionally be described as "opposite phase".

With respect to circuit (A), the analysis support apparatus 100, for example, identifies the nodes through which a positive phase signal that is input from an input terminal 101 passes and searches for a route through which a signal that has passed through nodes returns to the same node. In circuit (A), the analysis support apparatus 100 searches for a route that passes through a node 102 and returns to the same node 102.

The analysis support apparatus 100 then determines, based on the type of elements on the route, if the phase of the signal is reversed when the signal that has passed through the node 102 returns to the same node 102. In circuit (A), the analysis support apparatus 100 determines that the phase of the signal passing through the node 102 is the positive phase, that the phase of the signal is reversed to the opposite phase at an element 103, that the phase of the signal is reversed to the positive phase at an element 104, and that the signal returns to the node 102, without reversal of the phase at an element 105.

Therefore, the analysis support apparatus 100 determines that the phase of the signal is not reversed when the signal that has passed through the node 102 returns to the node 102. In other words, the analysis support apparatus 100 determines that the node 102 is a node included in a positive feedback loop.

This enables the analysis support apparatus 100 to detect and output a node that is included in a positive feedback loop and the voltage value of which has the potential not converging on a solution in the circuit analysis. In the following description, a node for which the voltage value thereof has the potential of not converging on a solution will occasionally be described as "undefined node".

For this reason, a user of the analysis support apparatus 100 can be informed of undefined nodes and set the voltage value of the undefined nodes so that the voltage value of the undefined nodes will converge on a solution. The user of the analysis support apparatus 100, by setting plural voltage values for an undefined node to calculate the initial voltage values that indicate plural operational states of the circuit, can reduce analysis oversight in the circuit analysis and can possibly obtain results of analysis corresponding to the actual circuit operation.

With respect to circuit (B), the analysis support apparatus 100, for example, identifies the nodes through which a positive phase signal that is input from an input terminal 101 passes and searches for a route through which the signal that has passed through nodes returns to the same node. In circuit (B), the analysis support apparatus 100 searches for a route that passes through a node 107 and returns to the same node 107.

The analysis support apparatus 100 then determines, based on the type of elements on the route, if the phase of the signal is reversed when the signal that has passed through the node 107 returns to the same node 107. In circuit (B), the analysis support apparatus 100 determines that the phase of the signal passing through the node 107 is the positive phase, that the phase of the signal is reversed to the opposite phase at an element 108, that the phase of the signal is reversed to the positive phase at an element 109, that the phase of the signal is reversed to the opposite phase at an element 110, and that the signal returns to the node 107, with reversal of the phase.

Therefore, the analysis support apparatus 100 determines that the phase of the signal is reversed when the signal that has passed through the node 107 returns to the node 107. In other words, the analysis support apparatus 100 determines that the node 107 is a node included in a negative feedback loop. A negative feedback loop is a loop in which the signal returns with a phase opposite to the phase of the signal at the previous pass. The analysis support apparatus 100 does not detect a node that is included in the negative feedback loop and the voltage value thereof does not diverge.

Figure 2:
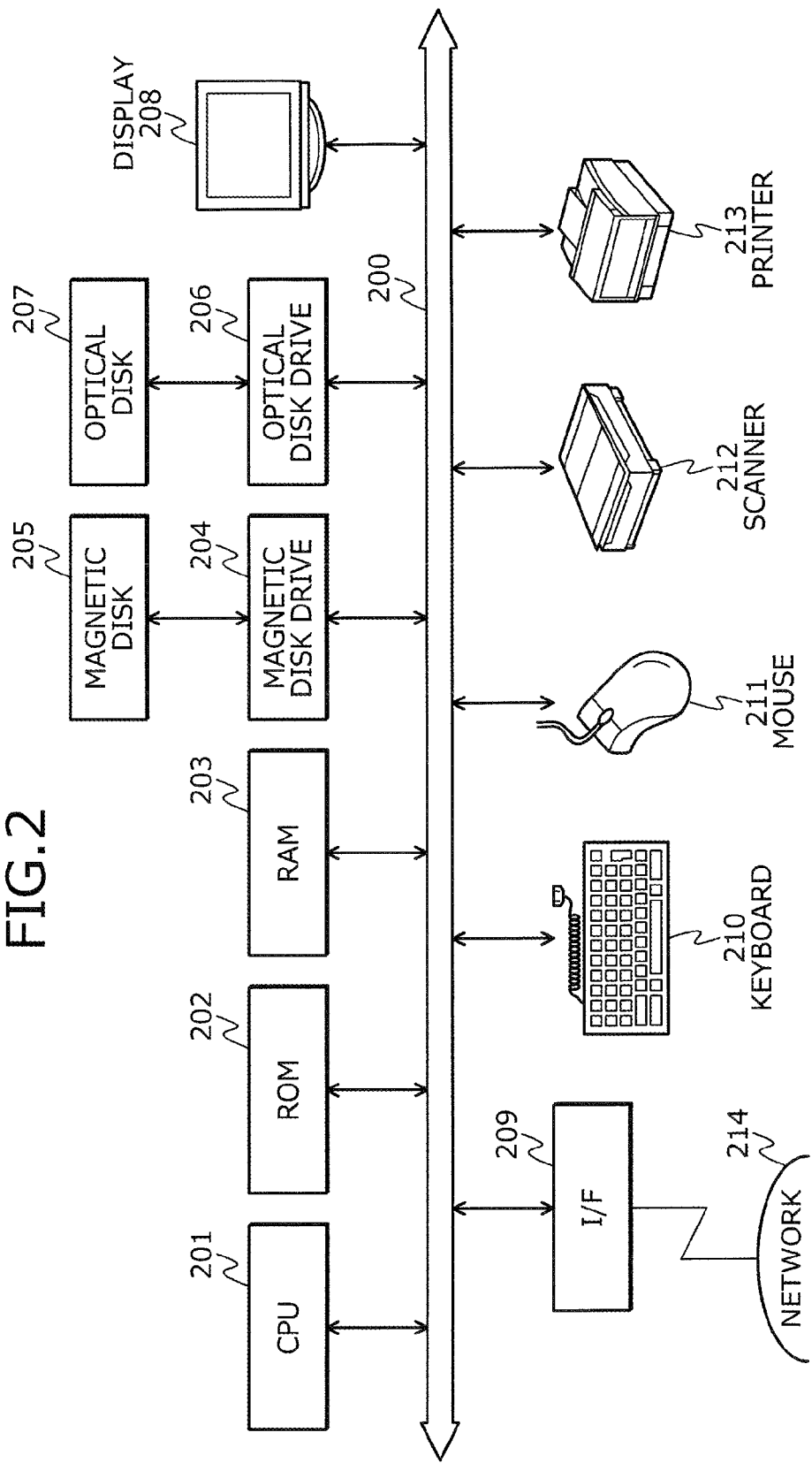
FIG. 2 is a block diagram of a hardware configuration example of the analysis support apparatus according to the embodiment.

FIG. 2 is a block diagram of a hardware configuration example of the analysis support apparatus according to the embodiment. As depicted in FIG. 2, the analysis support apparatus includes a central processing unit (CPU) 201, read-only memory (ROM) 202, random access memory (RAM) 203, a magnetic disk drive (Hard Disk Drive) 204, a magnetic disk 205, an optical disk drive 206, an optical disk 207, a display 208, an interface (I/F) 209, a keyboard 210, a mouse 211, a scanner 212, and a printer 213, respectively connected through a bus 200.

The CPU 201 governs overall control of the analysis support apparatus. The ROM 202 stores various types of programs such as boot program. The RAM 203 is used as a work area of the CPU 201. The magnetic disk drive 204, under the control of the CPU 201, controls the reading and writing of data with respect to the magnetic disk 205. The magnetic disk 205 stores data written thereto under the control of the magnetic disk drive 204.

The optical disk drive 206, under the control of the CPU 201, controls the reading and writing of data with respect to the optical disk 207. The optical disk 207 stores data written thereto under the control of the optical disk drive 206, the data being read from the optical disk 207 by a computer.

The display 208 displays, for example, data such as text, images, functional information, etc., in addition to a cursor, icons, and/or tool boxes. A liquid crystal display, a plasma display, etc., may be employed as the display 208.

The I/F 209 is connected to a network 214 such as a local area network (LAN), a wide area network (WAN), and the Internet through a communication line and is connected to other apparatuses through the network 514. The I/F 209 administers an internal interface with the network 514 and controls the input/output of data from/to external apparatuses. For example, a modem or a LAN adaptor may be employed as the I/F 209.

The keyboard 210 includes, for example, keys for inputting letters, numerals, and various instructions and performs the input of data. Alternatively, a touch-panel-type input pad or numeric keypad, etc. may be adopted. The mouse 211 is used to move the cursor, select a region, or move and change the size of windows. A track ball or a joy stick may be adopted provided each respectively has a function similar to a pointing device.

The scanner 212 optically reads an image and takes in the image data into the analysis support apparatus. The scanner 212 may have an optical character reader (OCR) function as well. The printer 213 prints image data and text data. The printer 213 may be, for example, a laser printer or an ink jet printer. Configuration may omit any 1 or more among the optical disk drive 206, the optical disk 207, the display 208, the keyboard 210, the mouse 211, the scanner 212, and the printer 213.

One example of the contents of a phase information table 300 will be described with reference to FIG. 3. The phase information table 300 is implemented, for example, by the ROM 202, the RAM 203, the magnetic disk 205, etc.

Figure 3:
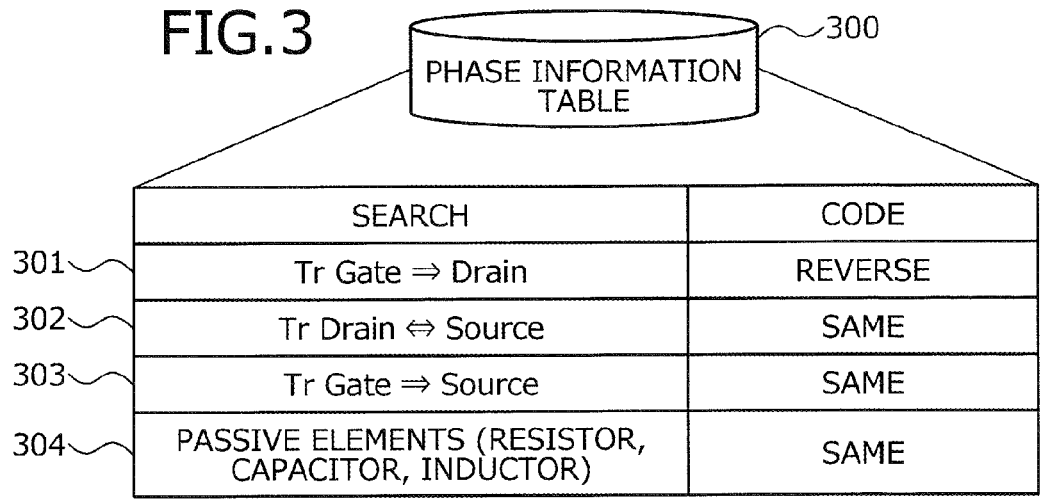
FIG. 3 is an explanatory diagram of one example of the contents of a phase information table 300.

FIG. 3 is an explanatory diagram of one example of the contents of the phase information table 300. As depicted in FIG. 3, the phase information table 300 has a code field correlated to a search field and stores, as a record, information set in each field for each search direction.

The search field stores the type of element through which the signal passes. The code field stores information that indicates whether the phase of the signal that has passed the type of element indicated by the search field is the same as before or is reversed. For example, record 301 correlates and stores information that indicates a transistor in the case of a signal passing from the gate terminal to the drain terminal, and information that indicates reversal of the phase of the signal.

A functional configuration example of the analysis support apparatus 100 will be described with reference to FIG. 4.

Figure 4:
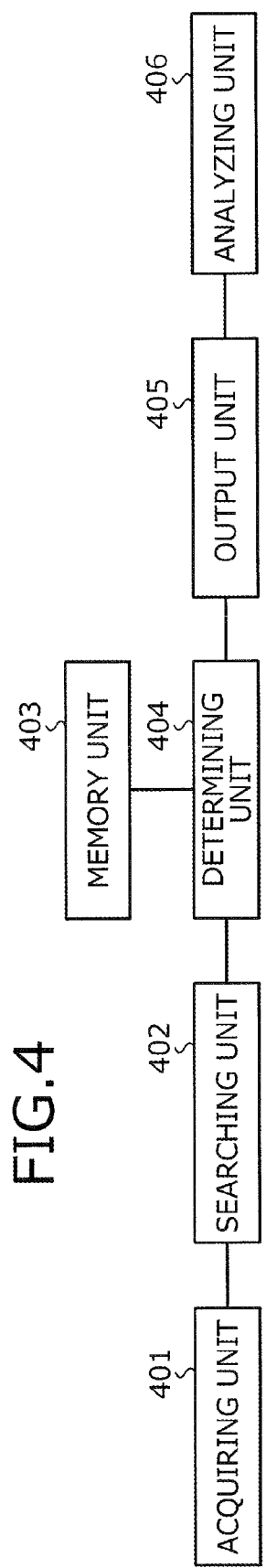
FIG. 4 is a block diagram of a functional configuration of the analysis support apparatus 100.

FIG. 4 is a block diagram of a functional configuration of the analysis support apparatus 100. The analysis support apparatus 100 includes an acquiring unit 401, a searching unit 402, a memory unit 403, a determining unit 404, an output unit 405, and an analyzing unit 406. Functions of the acquiring unit 401, the searching unit 402, the memory unit 403, the determining unit 404, the output unit 405, and the analyzing unit 406 are implemented by causing the CPU 201 to execute the programs stored in memory devices such as the ROM 202, the RAM 203, the magnetic disk 205, and the optical disk 207 depicted in FIG. 2, or by the I/F 209.

The acquiring unit 401 acquires circuit data that indicates plural elements within the circuit and the nodes to which at least two elements are connected among the plural elements. The circuit is a circuit-under-analysis such as a direct current analysis, an alternate current analysis, and a transient analysis. The circuit data is, for example, a netlist representing the circuit under analysis. The netlist will be described later with reference to FIG. 5.

The acquiring unit 401 may acquire terminal data that indicates a node as an input terminal, among the nodes described in the netlist. This enables the searching unit 402 to search for a looped route in the circuit-under-analysis, based on the circuit data acquired by the acquiring unit 401. Acquired data is stored, for example, in a storage area of the RAM 203, the magnetic disk 205, the optical disk 207, etc.

The searching unit 402 refers to the circuit data, identifies the nodes within the circuit in the sequence in which a signal input from the input terminal passes through the nodes within the circuit and searches for a route from the passage of the signal through a given node until the return of the signal to the given node.

The searching unit 402, for example, refers to the circuit data; sets, as the current node, a node that is the input terminal; identifies elements connected to the current node; and identifies an element through which the signal from the current node can pass, among the identified elements. The searching unit 402 then identifies the node ahead of the identified passable element through which the signal has passed and searches for a route between the current node and the identified node.

An element through which the signal can pass is, for example, a transistor in the case of the signal passing from the gate terminal to the drain terminal, a transistor in the case of the signal passing between the drain terminal and the source terminal, and a transistor in the case of the signal passing from the gate terminal to the source terminal. An element through which the signal can pass is, for example, passive elements such as a resistor, a capacitor, and an inductor.

The searching unit 402 sets the node ahead of the identified passable element through which the signal has passed as a new current node and repeats the processing of identifying the node ahead of the passable element through which the signal has passed from the new current node and searching for the route, in the same manner as in the processing described above. Here, to prevent back-tracking of the route, the searching unit 402 does not identify the node ahead of the passable element through which the signal has passed from the current node, if the node is the node identified immediately before.

In the processing described above, if a node included in a route that has already be searched is identified, the searching unit 402 detects, as a loop, a route starting at the identified node, tracing the route in the reverse direction, and returning to the identified node. This enables the searching unit 402 to detect a loop that may be a positive feedback loop. Results of the search are stored, for example, to a storage area of the RAM 203, the magnetic disk 205, the optical disk 207, etc.

The memory unit 403 correlates and stores the type of element and the information that indicates whether the phase of the signal is reversed when the signal passes through the element. The memory unit 403 correlates and stores, for example, information identifying a transistor and the information that indicates the reversal of the phase of the signal when the signal passes from the gate terminal of the transistor to the drain terminal thereof. The transistor is, for example, a metal-oxide-semiconductor field-effect transistor (MOSFET). The memory unit 403 stores, for example, the phase information table 300 depicted in FIG. 3.

The determining unit 404, based on the circuit data acquired by the acquiring unit 401, refers to the contents of the memory unit 403 and determines whether the phase of the signal is reversed when the signal that passed through a given node among plural nodes within the circuit returns to the given node.

The determining unit 404, for example, based on the type of elements on the route searched by the searching unit 402, refers to the contents of the memory unit 403 and determines whether the phase of the signal is reversed when the signal that passed through a given node returns to the given node.

The determining unit 404 determines that the phase of the signal is not reversed, for example, if the signal passes from the gate terminal of the transistor to the drain terminal thereof an even-number of times on the route. "0 times" is regarded as an even-number of times. In other words, the determining unit 404 refers to the contents of the memory unit 403 and determines that the phase of the signal is not reversed if the phase of the signal input from the input terminal is reversed an even-number of times on the route.

This enables the determining unit 404 to determine that, when the phase of the signal is not reversed, the loop searched by the searching unit 402 is a positive feedback loop. Results of the determination are stored, for example, to a storage area of the RAM 203, the magnetic disk 205, the optical disk 207, etc.

The output unit 405 outputs information that indicates the given node when it is determined by the determining unit 404 that the phase of the signal is not reversed. Output may be, for example, display on the display 208, print out by the printer 213, and transmission to an external device via the I/F 209. The information may be stored to a storage area of the RAM 203, the magnetic disk 205, the optical disk 207, etc.

The analyzing unit 406 performs the circuit analysis of the circuit with respect to a case of setting the voltage value of a power source within the circuit, and a case of setting the voltage value of the ground within the circuit, to a given node at which it is determined by the determining unit 404 that the phase of the signal is not reversed. For example, in a case where there are a first node and a second node at which it is determined by the determining unit 404 that the phase of the signal is not reversed, the analyzing unit 406 performs the circuit analysis of the circuit by setting the first node to be the voltage value of the power source and setting the second node to be the voltage value of the power source.

In this case, the analyzing unit 406 performs the circuit analysis of the circuit by setting the first node to be the voltage value of the power source and setting the second node to be the voltage value of the ground. Further, the analyzing unit 406 performs the circuit analysis of the circuit by setting the first node to be the voltage value of the ground and setting the second node to be the voltage value of the power source. Further, the analyzing unit 406 performs the circuit analysis of the circuit by setting the first node to be the voltage value of the ground and setting the second node to be the voltage value of the ground.

Thus, the analyzing unit 406 can reduce analysis oversights by setting plural initial values for the node at which the solution may be non-convergent. Results of the analysis are stored, for example, to a storage area of the RAM 203, the magnetic disk 205, the optical disk 207, etc.

One example of the acquired data will be described with reference to FIG. 5. The acquired data includes circuit data 502 and terminal data 501 acquired by the acquiring unit 401.

Figure 5:
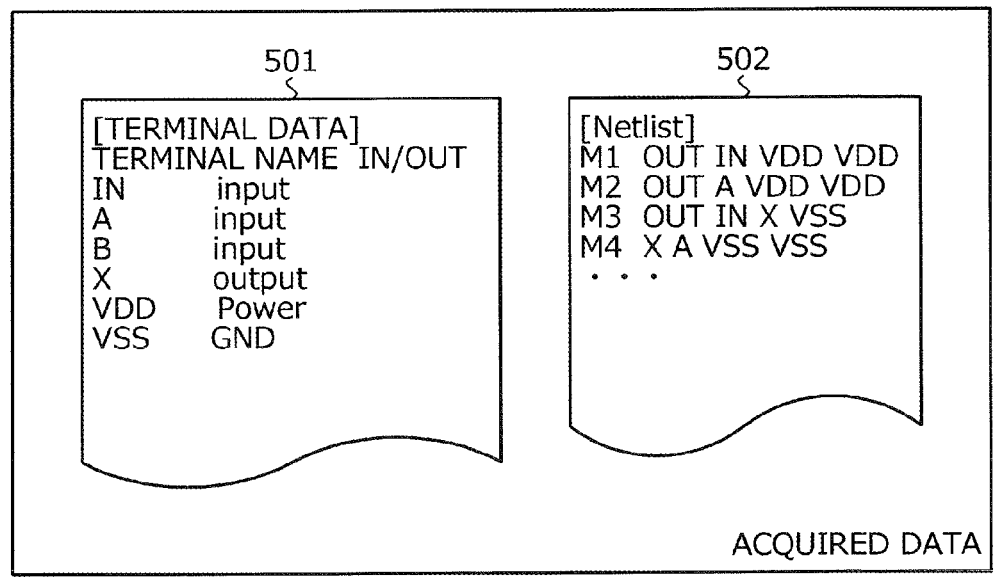
FIG. 5 is an explanatory diagram of one example of acquired data.

FIG. 5 is an explanatory diagram of one example of the acquired data. As depicted in FIG. 5, the terminal data 501 is data that indicates the name of the node as the input terminal, the output terminal, the power source, or the ground and the type of the terminal. In the example of FIG. 5, for example, "input" denotes the input terminal. "output" denotes the output terminal. "Power" denotes the power source. "GND" denotes the ground. In the example of FIG. 5, for example, it is indicated that the node "IN" is the node as the input terminal.

The circuit data 502 is data that indicates the element name and the node to which the element is connected. In the example of FIG. 5, a first column denotes the element name and second and subsequent columns denote the node names. The example depicted in FIG. 5 denotes, for example, the transistor "M1", the node "OUT" to which the drain terminal of the transistor "M1" is connected, the node "IN" to which the gate terminal thereof is connected, the node "VDD" to which the source terminal thereof is connected, and the node "VDD" to which a bulk terminal thereof is connected.

One example of a circuit 600 subject to analysis will be described with reference to FIG. 6.

Figure 6:
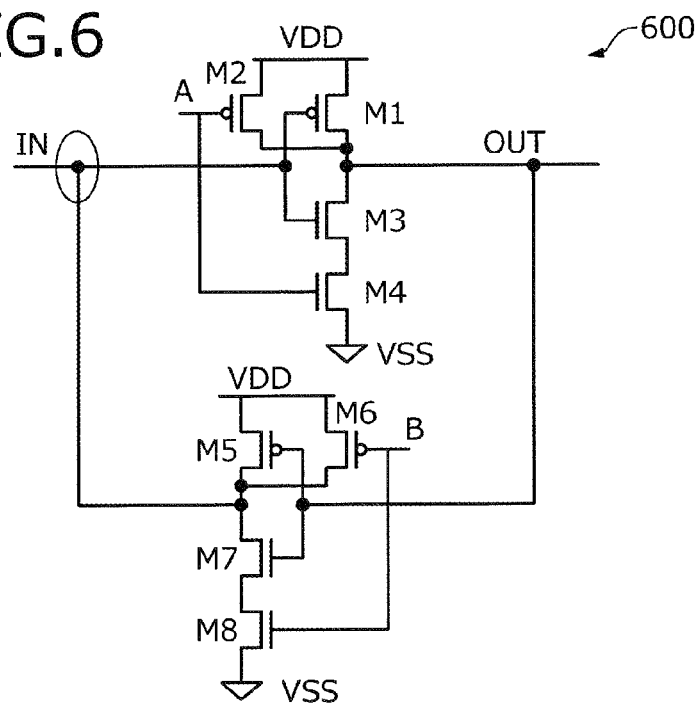
FIG. 6 is an explanatory diagram of a circuit 600 subject to analysis.

FIG. 6 is an explanatory diagram of the circuit 600 subject to analysis. As depicted in FIG. 6, the circuit 600 is the circuit 600 corresponding to the circuit data 502 depicted in FIG. 5 and is the circuit 600 including the transistors M1 to M8.

With reference to FIGS. 7 to 13, one example of an operation of the analysis support apparatus 100 will be described with respect to the circuit 600 depicted in FIG. 6.

Figure 7:
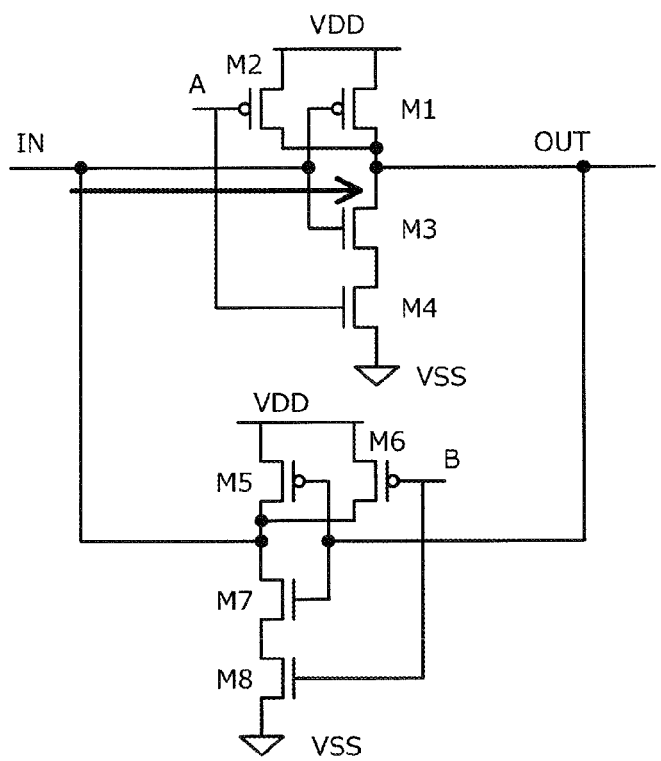

FIGS. 7, 8, 9, 10, 11, 12, and 13 are explanatory diagrams of one example of the operation of the analysis support apparatus 100. As depicted in FIG. 7, the analysis support apparatus 100 sets the node "IN" that is the input terminal to be the current node. The analysis support apparatus 100 identifies the transistors M1 and M3, as elements passable from the current node "IN". The analysis support apparatus 100 then identifies the node ahead of the identified transistors M1 and M3 through which the signal has passed.

The analysis support apparatus 100 prepares data that indicates the current node, each identified element, and the node ahead of each element through which the signal has passed. In the following description, data that indicates the current node, each identified element, and the node ahead of each element through which the signal has passed may be described as "connection data". In the example depicted in FIG. 7, the analysis support apparatus 100 prepares connection data [M1:IN:OUT], connection data [M1:IN:VDD], connection data [M3:IN:OUT], and connection data [M3:IN:X]. The connection data described above represents [element name: current node:node ahead of element through which signal has passed].

The analysis support apparatus 100 selects connection data from among the prepared connection data as the connection data that indicates a route to be searched for. In the example depicted in FIG. 7, the analysis support apparatus 100 selects connection data [M1:IN:OUT] and stores the data into work memory 701. The analysis support apparatus 100 stores unselected connection data into unprocessed-data memory 703. The analysis support apparatus 100 proceeds to the operation depicted in FIG. 8.

Figure 8:
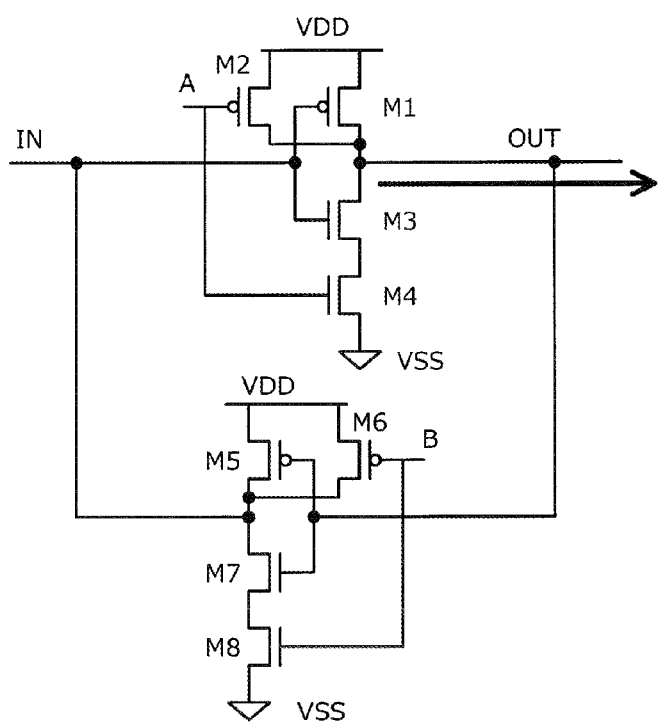

As depicted in FIG. 8, the analysis support apparatus 100, based on the selected connection data [M1:IN:OUT], determines whether the phase of the signal is reversed when the signal passes through the transistor M1 from the node "IN" to the node "OUT".

The analysis support apparatus 100 refers to the circuit data 502 and determines that when the signal passes through the transistor M1 from the node "IN" to the node "OUT", the signal passes from the gate terminal of the transistor M1 to the drain terminal thereof. The analysis support apparatus 100 refers to the phase information table 300 and determines that since the signal passes from the gate terminal of the transistor to the drain terminal thereof, the signal is reversed.

The analysis support apparatus 100 prepares phase data [IN:OUT:-] indicating that the signal is reversed when the signal passes through the route indicated by the selected connection data [M1:IN:OUT] and stores the data into node memory 702.

The analysis support apparatus 100 moves from the work memory 701 to a search history memory 704, the selected connection data [M1:IN:OUT], as connection data that indicates a searched route. The analysis support apparatus 100, based on the selected connection data [M1:IN:OUT], sets the current node to be the node "OUT" ahead of the transistor M1 through which the signal has passed. The analysis support apparatus 100 proceeds to the operation depicted in FIG. 9.

Figure 9:
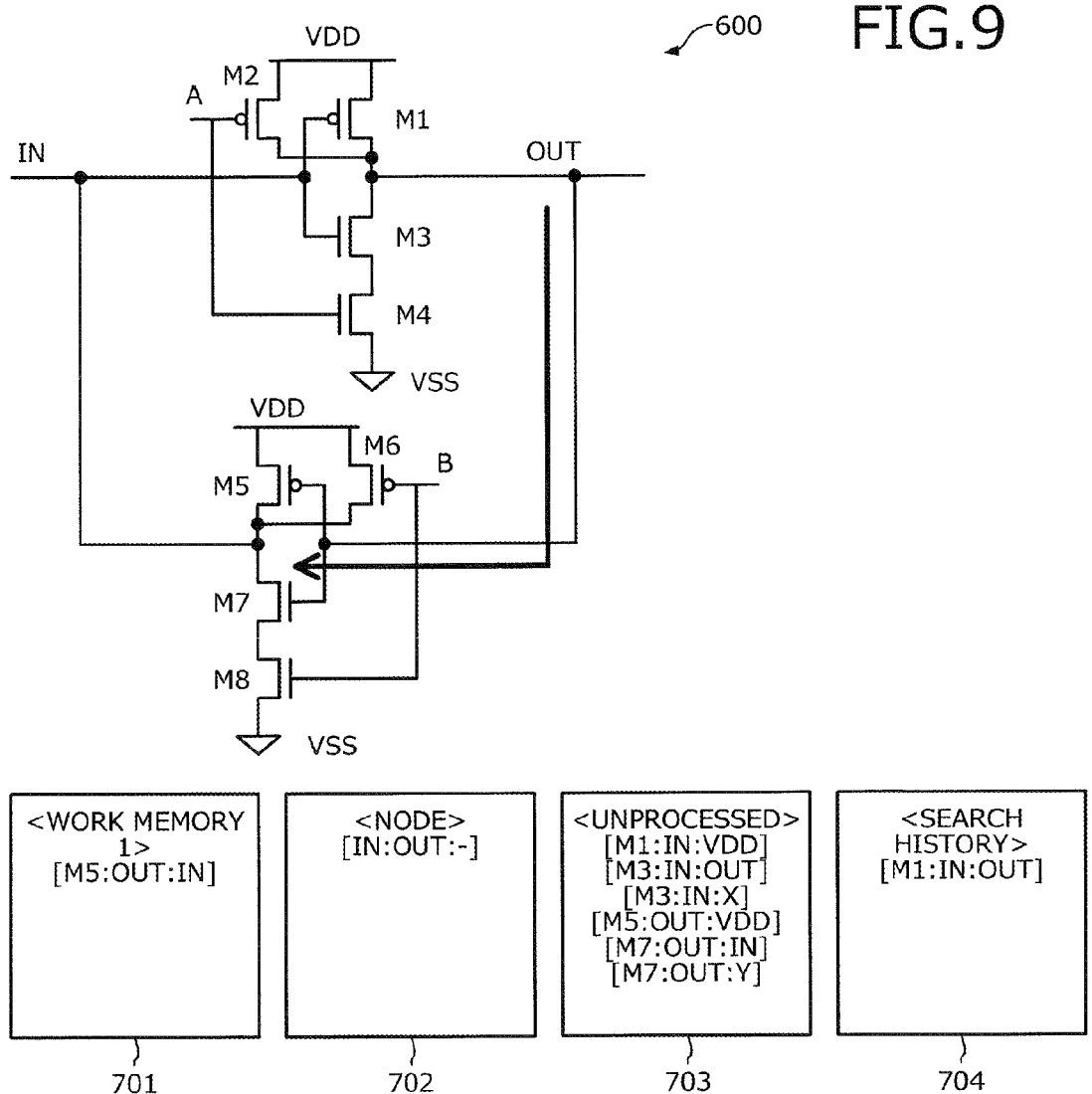

As depicted in FIG. 9, the analysis support apparatus 100, in the same manner as in FIG. 7, identifies the transistors M5 and M7, as elements passable from the current node "OUT". The analysis support apparatus 100 then identifies the node ahead of the identified transistors M5 and M7 through which the signal has passed.

The analysis support apparatus 100 prepares data that indicates the current node, each identified element, and the node ahead of each element through which the signal has passed. In the example depicted in FIG. 9, the analysis support apparatus 100 prepares connection data [M5:OUT:IN], connection data [M5:OUT:VDD], connection data [M7:OUT:IN], and connection data [M7:OUT:Y].

The analysis support apparatus 100 selects connection data from among the prepared connection data as the connection data that indicates a route to be searched for. In the example depicted in FIG. 9, the analysis support apparatus 100 selects connection data [M5:OUT:IN] and stores the data into work memory 701. The analysis support apparatus 100 stores unselected connection data into unprocessed-data memory 703. The analysis support apparatus 100 proceeds to the operation depicted in FIG. 10.

As depicted in FIG. 10, the analysis support apparatus 100, based on the selected connection data [M5:OUT:IN], determines whether the phase of the signal is reversed when the signal passes through the transistor M5 from the node "OUT" to the node "IN".

The analysis support apparatus 100 refers to the circuit data 502 and determines that when the signal passes through the transistor M5 from the node "OUT" to the node "IN", the signal passes from the gate terminal of the transistor M5 to the drain terminal thereof. The analysis support apparatus 100 refers to the phase information table 300 and determines that since the signal passes from the gate terminal of the transistor to the drain terminal thereof, the signal is reversed.

The analysis support apparatus 100 prepares phase data [OUT:IN:-] indicating that the signal is reversed when the signal passes through the route indicated by the selected connection data [M5:OUT:IN] and stores the data into node memory 702.

The analysis support apparatus 100 determines whether the node "IN" ahead of the route indicated by the selected connection data [M5:OUT:IN] through which the signal has passed is the same as the node as a starting point of the route indicated by any of the connection data of the search history memory 704.

In the example depicted in FIG. 10, the analysis support apparatus 100 determines that the node "IN" ahead in the route indicated by the selected connection data [M5:OUT:IN] through which the signal has passed is the same as the node "IN", which is the starting point of the route indicated by connection data [M1:IN:OUT] of the search history memory 704.

Thus, the analysis support apparatus 100 refers to the work memory 701 and the search history memory 704, detects the loop starting at the node "IN", passing through the node "OUT", and returning to the node "IN", within the circuit 600 as the subject of analysis. The analysis support apparatus 100 then proceeds to the operation depicted in FIG. 11.

As depicted in FIG. 11, the analysis support apparatus 100 refers to the node memory 702, stores "−1" into work memory 1101 if there is a case of reversal of the phase of the signal in the loop starting at the node "IN", passing through the node "OUT", and returning to the node "IN". The analysis support apparatus 100 refers to the node memory 702, stores "1" into the work memory 1101 if there is a case of the phase of the signal remaining the same in the loop starting at the node "IN", passing through the node "OUT", and returning to the node "IN". The analysis support apparatus 100 calculates a value obtained by multiplying the values stored in the work memory 1101 as Ans.

If the Ans is "1", then the analysis support apparatus 100 determines that the phase is reversed an even-number of times in the loop and that the loop is a positive feedback loop. "0 times" is regarded to be an even-number of times. On the other hand, if the Ans is "−1", then the analysis support apparatus 100 determines that the phase is reversed an odd-number of times in the loop and that the loop is a negative feedback loop.

In the example depicted FIG. 11, since the phase of the signal is reversed by passing through the transistor M1 in the loop starting at the node "IN", passing through the node "OUT", and returning to the node "IN", the analysis support apparatus 100 stores "−1" into the work memory 1101. Since the phase of the signal is reversed by passing through the transistor M5 in the loop starting at the node "IN", passing through the node "OUT", and returning to the node "IN", the analysis support apparatus 100 stores "−1" into the work memory 1101.

The analysis support apparatus 100 calculates a value obtained by multiplying "−1" by "−1" as Ans "1". Since the Ans is "1", the analysis support apparatus 100 determines that the loop is a positive feedback loop. The analysis support apparatus 100 then proceeds to the operation depicted in FIG. 12.

Figure 12:
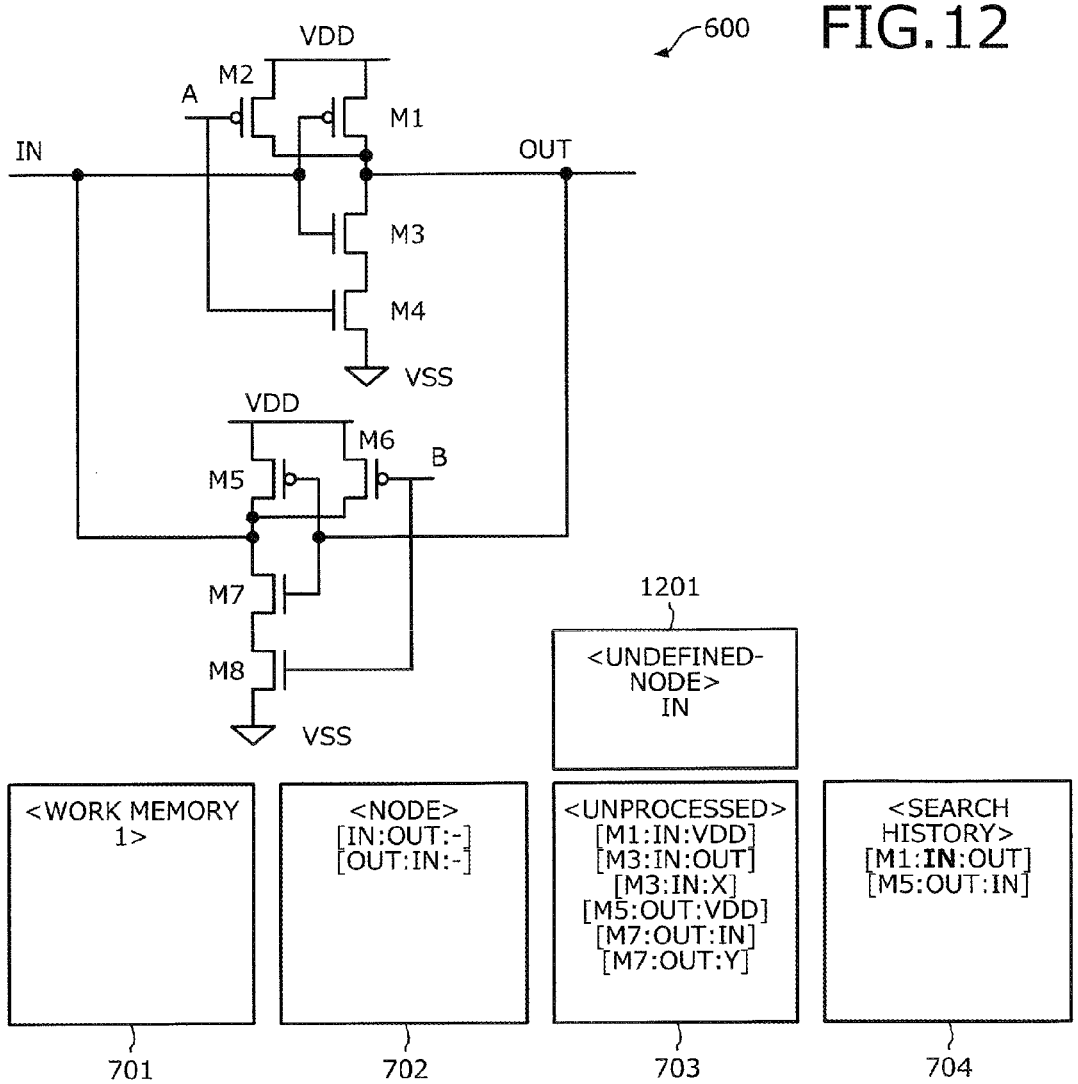

As depicted in FIG. 12, since the loop starting at the node "IN", passing through the node "OUT", and returning to the node "IN" is determined to be a positive feedback loop, the analysis support apparatus 100 determines that the node "IN" is an undefined node included in a positive feedback loop. The analysis support apparatus 100 stores the node "IN" determined as an undefined node into an undefined-node memory 1201.

The analysis support apparatus 100 moves the selected connection data [M5:OUT:IN], as the connection data that indicates the searched route, from the work memory 701 to the search history memory 704. The analysis support apparatus 100 then proceeds to the operation depicted in FIG. 13.

Figure 13:
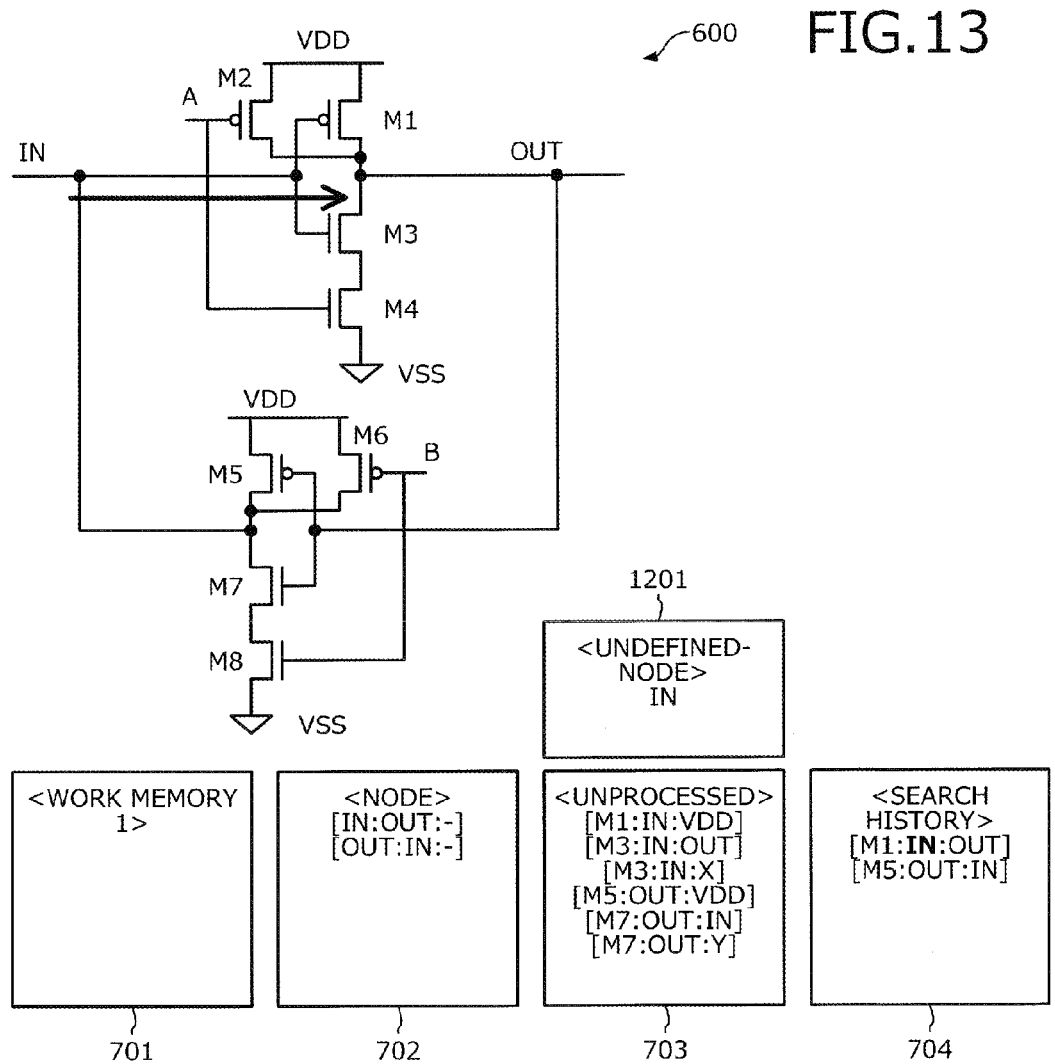

As depicted in FIG. 13, since the loop has been searched for, the analysis support apparatus 100 proceeds to search for another route. In the example of FIG. 13, the analysis support apparatus 100 selects connection data [M3:IN:OUT] from among the unselected connection data stored in the unprocessed-data memory 703 and stores the data into the work memory 701. The analysis support apparatus 100 searches for a route in the same manner as in the processing of FIGS. 8 to 12.

This enables the analysis support apparatus 100 to store a node that is included in a positive feedback loop, the voltage value of which may possibly diverge, and the voltage value of which has the potential of not converging on a solution in the circuit analysis. The analysis support apparatus 100 can notify the user of the analysis support apparatus 100 of stored information that indicates the undefined node.

As a result, the user of the analysis support apparatus 100, in the case of performing circuit analysis of the circuit 600, can perform the circuit analysis, knowing that the reported node is an undefined node, and can adjust the voltage value of the undefined node, thereby reducing analysis oversights.

The analysis support apparatus 100, based on the stored information that indicates the undefined node, may set the undefined node to have the given voltage value and automatically perform the circuit analysis, using circuit analyzing software. Circuit analyzing software is, for example, SPICE. As a result, since the analysis support apparatus 100 performs the circuit analysis by adjusting the voltage value of the undefined node, analysis oversights can be reduced.

One example of analysis support processing of the analysis support apparatus 100 will be described with reference to FIG. 14.

FIG. 14 is a flowchart of one example of the analysis support processing of the analysis support apparatus 100. In FIG. 14, the analysis support apparatus 100 determines whether the circuit data 502 has been input (step S1401). If the circuit data 502 has not been input (step S1401: NO), then the analysis support apparatus 100 returns the operation at step S1401.

On the other hand, if the circuit data 502 has been input (step S1401: YES), then the analysis support apparatus 100 executes the search processing depicted in FIG. 15 (step S1402) to detect undefined nodes. The analysis support apparatus 100 prepares pattern information that indicates all combinations in the case of setting each of the detected undefined nodes to have the given voltage value (step S1403).

The analysis support apparatus 100 selects unselected pattern information from the prepared pattern information (step S1404). The analysis support apparatus 100 performs the circuit analysis on the circuit 600 under analysis for a case of setting the combination of the voltage values of the undefined nodes, as indicated by the selected pattern information (step S1405).

The analysis support apparatus 100 determines whether unselected pattern information is present (step S1406). If unselected pattern information is present (step S1406: YES), then the analysis support apparatus 100 returns the operation at step S1404.

On the other hand, if no unselected pattern information is present (step S1406: NO), then the analysis support apparatus 100 ends the analysis support processing. The analysis support processing enables the analysis support apparatus 100 to detect undefined nodes, set the detected undefined nodes to have the given voltage values, and automatically perform the circuit analysis, using the circuit analyzing software. As a result, since the analysis support apparatus 100 performs the circuit analysis by adjusting the voltage values of the undefined nodes, analysis oversights can be reduced.

With reference to FIG. 15, one example of the search processing at step S1402 will be described.

FIG. 15 is a flowchart of one example of the search processing at step S1402. As depicted in FIG. 15, the analysis support apparatus 100 selects an unselected node as the input terminal (step S1501). The analysis support apparatus 100 then extracts an element connected to the selected node as the input terminal and prepares the connection data (step S1502).

The analysis support apparatus 100 determines whether an element has been extracted (step S1503). If no element has been extracted (step S1503: NO), then the analysis support apparatus 100 proceeds to step S1510.

On the other hand, if an element has been extracted (step S1503: YES), then the analysis support apparatus 100 selects unselected connection data from the prepared connection data (step S1504). The analysis support apparatus 100 prepares the phase data, based on the selected connection data (step S1505). The analysis support apparatus 100 stores the prepared phase data into the node memory 702 (step S1506).

The analysis support apparatus 100 determines whether, among the nodes as the starting point of the routes indicated by the connection data stored in the search history memory 704, a node is present that matches a node ahead of the route indicated by the selected connection data and through which the signal has passed (step S1507).

If such a node is present (step S1507: YES), then the analysis support apparatus 100 executes loop determination processing to be described later with reference to FIG. 16 (step S1508) and returns to the operation at step S1510.

On the other hand, if no such node is present (S1507: NO), then the analysis support apparatus 100 stores the selected connection data into the search history memory 704 (step S1509) and proceeds to the operation at step S1502.

At step S1510, the analysis support apparatus 100 determines whether unselected connection data is present (step S1510). If unselected connection data is present (step S1510: YES), then the analysis support apparatus 100 returns the operation at step S1502.

On the other hand, if no unselected connection data is present (step S1510: NO), then the analysis support apparatus 100 determines whether an unselected node as the input terminal is present (step S1511). If an unselected node as the input terminal is present (step S1511: YES), then the analysis support apparatus 100 returns the operation at step S1501.

On the other hand, if no unselected node as the input terminal is present (step S1511: NO), then the analysis support apparatus 100 ends the search processing. The search processing enables the analysis support apparatus 100 to detect the undefined node.

With reference to FIG. 16, the loop determination processing at step S1508 will be described.

FIG. 16 is a flowchart of the loop determination processing at step S1508. In FIG. 16, the analysis support apparatus 100 searches for a loop, based on the connection data (step S1601). The analysis support apparatus 100 then determines whether a found loop is a positive feedback loop (step S1602).

If the loop is a positive feedback loop (step S1602: YES), then the analysis support apparatus 100 stores the node as an undefined node into the node memory 702 (step S1603) and proceeds to the operation at step S1604. On the other hand, if the loop is not a positive feedback loop (step S1602: NO), then the analysis support apparatus 100 proceeds to the operation at step S1604.

At step S1604, the analysis support apparatus 100 stores the selected connection data into the search history memory 704 (step S1604) and ends the loop determination processing. The loop determination processing enables the analysis support apparatus to detect an undefined node.

As described, according to the analysis support apparatus 100, it can be determined whether the phase of the signal is reversed when the signal that passed through a given node among plural nodes within the circuit 600 returns to the given node. This enables the analysis support apparatus 100 to detect an undefined node included in a positive feedback loop within the circuit 600.

Thus, the user of the analysis support apparatus 100 can be informed of undefined nodes and set the voltage value of the undefined nodes so that the voltage value will converge on a solution. The user of the analysis support apparatus 100, by setting the undefined node to plural voltage values to calculate the initial voltage values that indicates plural operations of the circuit, can reduce analysis oversights in the circuit analysis and can possibly obtain analysis results corresponding to the actual operation of the circuit. The user of the analysis support apparatus 100 can detect a node of high impedance included in a positive feedback loop within the circuit 600.

The analysis support apparatus 100 enables circuit analysis of the circuit 600 with respect to the case of setting a detected undefined node to have the voltage value of the power source within the circuit 600, and the case of setting the detected undefined node to have the voltage value of the ground within the circuit 600. Consequently, since the analysis support apparatus 100 performs the circuit analysis by adjusting the voltage value of the undefined node, analysis oversights can be reduced.

Analysis oversights may be reduced by setting all the nodes within the circuit-under-analysis to plural patterns of voltage values. In this case, however, the time required for the analysis increases. On the other hand, the analysis support apparatus 100, by detecting the undefined node and setting the undefined node to plural patterns of voltage values, can reduce analysis oversights while reducing the time consumed for the analysis, as compared with the case of setting all the nodes to plural patterns of voltage values for analysis.

The analysis support method described in the present embodiment may be implemented by executing a prepared program on a computer such as a personal computer and a workstation. The program is stored on a non-transitory, computer-readable recording medium such as a hard disk, a flexible disk, a CD-ROM, an MO, and a DVD, read out from the computer-readable medium, and executed by the computer. The program may be distributed through a network such as the Internet.

According to one aspect of an embodiment, enables circuit analysis support.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An analysis support apparatus comprising:
a processor that is configured to:
acquire circuit data that indicates a plurality of elements within a circuit and a node to which at least two elements are connected among the elements, and
determine, based on the acquired circuit data and by referring to a memory unit that correlates and stores for each of the elements, the type of the element and information that indicates whether the phase of a signal is reversed when the signal passes through the element, whether the phase of the signal is reversed when the signal that passed through a given node among a plurality of nodes within the circuit returns to the given node; and
an output unit that outputs information that indicates the given node when the processor determines that the phase of the signal is not reversed, wherein
the processor, by referring to the memory unit, determines that the phase of the signal is not reversed when the signal input from the input terminal has passed from the gate terminal of the transistor to the drain terminal of the transistor an even-number of times on the route.

2. The analysis support apparatus according to claim 1, wherein
the processor is further configured to
refer to the circuit data, identify the nodes within the circuit in a sequence in which the signal input from an input terminal within the circuit passes through the nodes, and search for a route from a passage of the signal through the given node until a return of the signal to the given node, and
the processor, based on the type of the elements on the route searched and by referring to the memory unit, determines whether the phase of the signal is reversed when the signal that passed through the given node, returns to the given node.

3. The analysis support apparatus according to claim 2, wherein
the memory unit correlates and stores information that indicates a transistor and information that indicates reversal of the phase of the signal when the signal passes from a gate terminal of the transistor to a drain terminal of the transistor, and
the processor, by referring to the memory unit, determines that the phase of the signal is not reversed when the signal input from the input terminal has passed from the gate terminal of the transistor to the drain terminal of the transistor an even-number of times on the route, and
the processor, by referring to the memory unit, determines that the phase of the signal is not reversed when the signal input from the input terminal has passed from the gate terminal of the transistor to the drain terminal of the transistor an even-number of times on the route.

4. The analysis support apparatus according to claim 1, wherein
the processor is further configured to
perform circuit analysis of the circuit with respect to a case of setting the given node, for which it is determined that the phase of the signal is not reversed, to have a voltage value of a power source within the circuit, and a case of setting the given node, for which it is determined that the phase of the signal is not reversed, to have a voltage value of a ground within the circuit.

5. An analysis support method comprising:
acquiring circuit data that indicates a plurality of elements within a circuit and a node to which at least two elements are connected among the elements, and
determining, based on the acquired circuit data and by referring to a memory unit that correlates and stores for each of the elements, the type of the element and information that indicates whether the phase of a signal is reversed when the signal passes through the element, whether the phase of the signal is reversed when the signal that passed through a given node among a plurality of nodes within the circuit, returns to the given node; and
outputting information that indicates the given node, when the phase of the signal is determined to not be reversed, wherein
the analysis support method is executed by a computer, and
the processor, by referring to the memory unit, determines that the phase of the signal is not reversed when the signal input from the input terminal has passed from the gate terminal of the transistor to the drain terminal of the transistor an even-number of times on the route.

6. A non-transitory, computer-readable recording medium that stores an analysis support program that causes a computer to execute a process comprising:
acquiring circuit data that indicates a plurality of elements within a circuit and a node to which at least two elements are connected among the elements, and
determining, based on the acquired circuit data and by referring to a memory unit that correlates and stores for each of the elements, the type of the element and information that indicates whether the phase of a signal is reversed when the signal passes through the element, whether the phase of the signal is reversed when the signal that passed through a given node among a plurality of nodes within the circuit, returns to the given node; and
outputting information that indicates the given node, when the phase of the signal is determined to not be reversed, wherein
the processor, by referring to the memory unit, determines that the phase of the signal is not reversed when the signal input from the input terminal has passed from the gate terminal of the transistor to the drain terminal of the transistor an even-number of times on the route.

* * * * *